United States Patent

[11] 3,581,304

[72] Inventors Ronald Y. Paradise
Hillsdale;
Marvin Masel, W. Englewood; Bob N. Naydan, Oakland; John D. Brinkman, Pine Brook, all of, N.J.

[21] Appl. No. 638,846
[22] Filed May 16, 1967
[45] Patented May 25, 1971
[73] Assignee Singer-General Precision, Inc.
Little Falls, N.J.

[54] ANALOG-TO-DIGITAL CYCLIC FORWARD FEED SUCCESSIVE APPROXIMATION CONVERSION EQUIPMENT
2 Claims, 3 Drawing Figs.

[52] U.S. Cl. 340/347
[51] Int. Cl. H03k 13/14
[50] Field of Search 340/347 A, 347 D

[56] References Cited
UNITED STATES PATENTS

| | | | |
|---|---|---|---|
| 3,072,332 | 1/1963 | Margopoulos | 340/347X |
| 3,187,323 | 6/1965 | Flood et al. | 340/347 |
| 3,221,324 | 10/1965 | Margodoulos | 340/347 |
| 3,354,452 | 11/1967 | Bard et al. | 340/347 |
| 3,483,550 | 12/1969 | Max | 340/347 |

*Primary Examiner*—Maynard R. Wilbur
*Assistant Examiner*—Michael K. Wolensky
*Attorneys*—S. A. Giarratana and G. B. Oujevolk ABSTRACT: An analog value to be converted to a digital count is first converted into a coarse digital number by applying the analog signal to a ladder network converter which converts the signal into digital form by successive approximation techniques and transfers this digital number to an output register. The value of the number in the register is also reconverted back to analog form by a summing network and subtracted from the original analog signal. The difference between the original and the reconverted values is then amplified by a proper scale factor and again converted to obtain a second digital number in the same converter. The most significant digits of the second digital number are then compared with the corresponding least significant digits of the first number by logic means and the two numbers are then properly consolidated into one number, in a form suitable for use by external equipment, which represents the input analog value with an accuracy higher than that inherent in the analog-to-digital converter being used.

INVENTOR.
RONALD Y. PARADISE
MARVIN MASEL
BOB N. NAYDAN
JOHN BRINKMAN
BY
George B. Oujevolk
ATTORNEY

PATENTED MAY 25 1971 3,581,304

SHEET 2 OF 2

INVENTORS
RONALD Y. PARADISE
MARVIN MASEL
BOB N. NAYDAN
JOHN BRINKMAN.

BY George B. Oujevolk
ATTORNEY

ANALOG-TO-DIGITAL CYCLIC FORWARD FEED SUCCESSIVE APPROXIMATION CONVERSION EQUIPMENT

BRIEF SUMMARY OF THE INVENTION

The present invention relates to the conversion of an analog value to a binary digital value, and more particularly to a system for accomplishing this to a high degree of accuracy when using only very coarse conversion equipment.

To better explain the operation of the system contemplated herein, a simple explanation will first be given. Assume that it is desired to convert an analog value to an eight-place binary value but only a crude converter is available. The analog value can be first converted to a five-place first coarse digital value using the crude converter set at a low scale factor. The digital value so obtained can then be converted back to an analog value, and compared with the true analog value. The difference between the two analog values can again be converted to a five-place second digital value, but using a higher scale factor. The two digital values so obtained can then be used to obtain an eight-place value. A simple illustration will make the explanation clearer.

EXAMPLE I

It is desired to convert an analog voltage having a value of 101 Volts, to a value in the digital system

| | MBS | | | | | | | |
|---|---|---|---|---|---|---|---|---|
| Binary Value | $2^7$ | $2^6$ | $2^5$ | $2^4$ | $2^3$ | $2^2$ | $2^1$ | $2^0$ |
| Equivalent weight in Volts ⅛scale factor¼ | 128 | 64 | 32 | 16 | 8 | 4 | 2 | 1 |

Assuming that use is made of a converter which has only low precision, say the closest answer (including resolution and other errors) is 128 Volts, or its binary equivalent 10000*xxx*. This value so obtained is converted back to analog form, compared with the input, and in this case subtracted from the input to obtain an analog difference value of −27 Volts. By converting this difference voltage, using the same low precision converter, but with an appropriately higher scale factor, the answer obtained is −*xxx*11011. This second value may be then combined with the first value as follows:

| | | |
|---|---|---|
| First Binary Value | 10000*xxx* | |
| Second Binary Value | −*xxx*11011 | (logic requires subtraction) |
| Final Corrected Binary Value | 01100101 | |

Note the final corrected binary value represents the correct answer, 101 Volts.

EXAMPLE II

It is desired to convert an analog value having a weight of 77 Volts to a value in the binary system as explained hereinbefore.

A first conversion is made using the first scale factor of Example I and the following coarse binary value is obtained: 01000xxx. This value is reconverted back to an analog value and yields a weight of 64 Volts, which is a difference of 13 Volts from the original value of 77 Volts. This difference of 13 Volts again converted into binary form using the converter with an appropriately raised scale factor yielding: *xxx*01101. The two values thus obtained are then compared as follows:

01000*xxx*

*xxx*01101 (logic requires addition)

01001101 = Binary Equivalent of 77 Volts.

FUNCTIONAL DESCRIPTION

Figure 1:
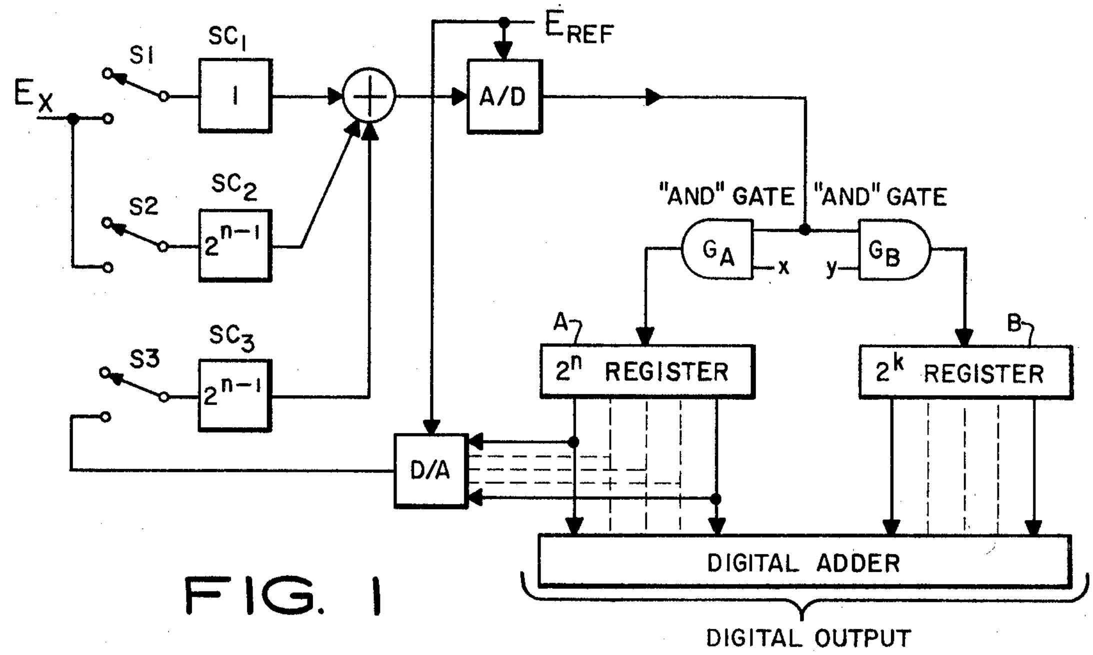
FIG. 1 is a block diagram of an explanation of the invention concept.

A system using the foregoing technique appears in FIG. 1, wherein an analog value $E_x$ is fed to a converter which will convert the analog value $E_x$ into a binary value of "*n*" bits. Each of switches S1, S2 and S3 leads into a scale factor change means $SC_1$, $SC_2$ and $SC_3$ which will respectively change the scale factors to "1;" "$2^{n11}$; " and "$2^{n11}$ ("*n*" being the number of bits). The scale factor change means $SC_1$ to $SC_3$ provide an output to an adder "+" which in turn provides an output to an analog-to-digital converter A/D which provides a digital output in binary form to register "A" or register "B" depending on the signal at AND gates $G_A$ and $G_B$. These registers can store $2^n$ bits.

The first step in obtaining a converter output is to apply the signal into analog-to-digital converter A/D by closing switch $S_1$. The answer for this first conversion is stored in register A. This first coarse value "A" in register A is converted back to analog form by means of digital-to-analog converter D/A.

The second step in obtaining a converted output is to apply both the signal and the converted analog value "A" into analog-to-digital converter A/D by closing switches $S_2$ and $S_3$ and opening switch $S_1$. Note that both the signal $E_x$ and the converted analog value "A" are fed through the appropriate scale factor means $SC_2$ and $SC_3$ into adder "+," which combines them to form a difference signal. It is the difference signal, thus obtained, which is applied to analog-to-digital converter A/D. The answer of this second conversion is stored in register B.

The coarse value "A" in register A is converted back into analog form by means of digital-to-analog converter D/A and scale factor change means $SC_3$ having a scale factor of $2^{n11}$. The analog input $E_x$ is also fed to scale factor change means $SC_2$ and the outputs of $SC_2$ and $SC_3$ can be added in adder "+."

EXAMPLE III

Assume an unknown analog signal is applied $E_x$. It is required to produce a digital output corresponding to the unknown voltage.

Step 1–$S_1$ is closed, $S_2$ and $S_3$ open.

Step 2–The unknown $E_x$ is converted in the analog-to-digital converter to yield a digital output "A" at a scale factor related to $E_{ref}$. Then $A \cdot E_{ref} - E_x$ = error. If the error in the converter A/D is stated as some plus or minus multiple of the least resolution bit termed for convenience as $\pm M_1$; $M_1$ could take any value such that:

$$A \cdot E_{\rm ref} - E_x = \frac{\pm M_1 \cdot E_{\rm ref}}{2^n}$$

then:

$$A = \frac{E_x}{E_{\rm ref}} \pm \frac{M_1}{2^n}$$

Step 3–"A," the digital quantity, is applied to the digital-to-analog converter D/A producing an analog quantity $$-\left(A \cdot E_{\rm ref} \pm \frac{N_1}{2^n} E_{\rm ref}\right) = -E_{\rm ref}\left(A \pm \frac{N_1}{2^n}\right)$$

where $N_1$ is the analog error of the converter D/A.

Step 4–$S_1$ open, $S_2$ and $S_3$ closed.

Step 5–The output of converter D/A scaled by ($2^{n11}$) and the input unknown $E_x$ also scaled by ($2^{n11}$) are summed by adder "+" and applied to the converter A/D.

This yields a value "*B*" similar to that obtained in Step 2.

$$B = \frac{\left[E_x - E_{\rm ref}\left(A \pm \frac{N_1}{2^n}\right)\right](2^{n-1})}{E_{\rm ref}} + \frac{\rm Error}{E_{\rm ref}}$$

Since the same converter A/D is used, the error is $$\pm\frac{M_1 E_{ref}}{2^n}$$

then $$B=\left[\frac{E_x}{E_{ref}}-A\pm\frac{N_1}{2^n}\right](2^{n-1})\pm\frac{M_1}{2^n}$$

Step 6–The digital quantity "A" is now added to the digital quantity $B/2^{(n-1)}$ The total digital output "C" is:

$$C=\frac{E_x}{E_{ref}}\pm\frac{N_1}{2^n}\pm\frac{M_1}{2^n(2^{n-1})}$$

EXAMPLE IV

Following the steps of the previous example, but giving values to the parameters, let $N_1=0$ $n=5$ $M_1=1$ $$\text{Digital Output "}C\text{"}=\frac{E_x}{E_{ref}}\pm\frac{1}{2^5(2^5-1)}$$

$$=\frac{E_x}{E_{ref}}\pm\frac{1}{2^9}$$

$$=\frac{E_x}{E_{ref}}\pm\frac{1}{512}$$

Therefore, with an A/D converter which has an accuracy of $$\frac{1}{2^n}=\frac{1}{32},$$

or approximately 3 percent, a conversion is accomplished to an accuracy of approximately 0.2 percent.

Figure 2:
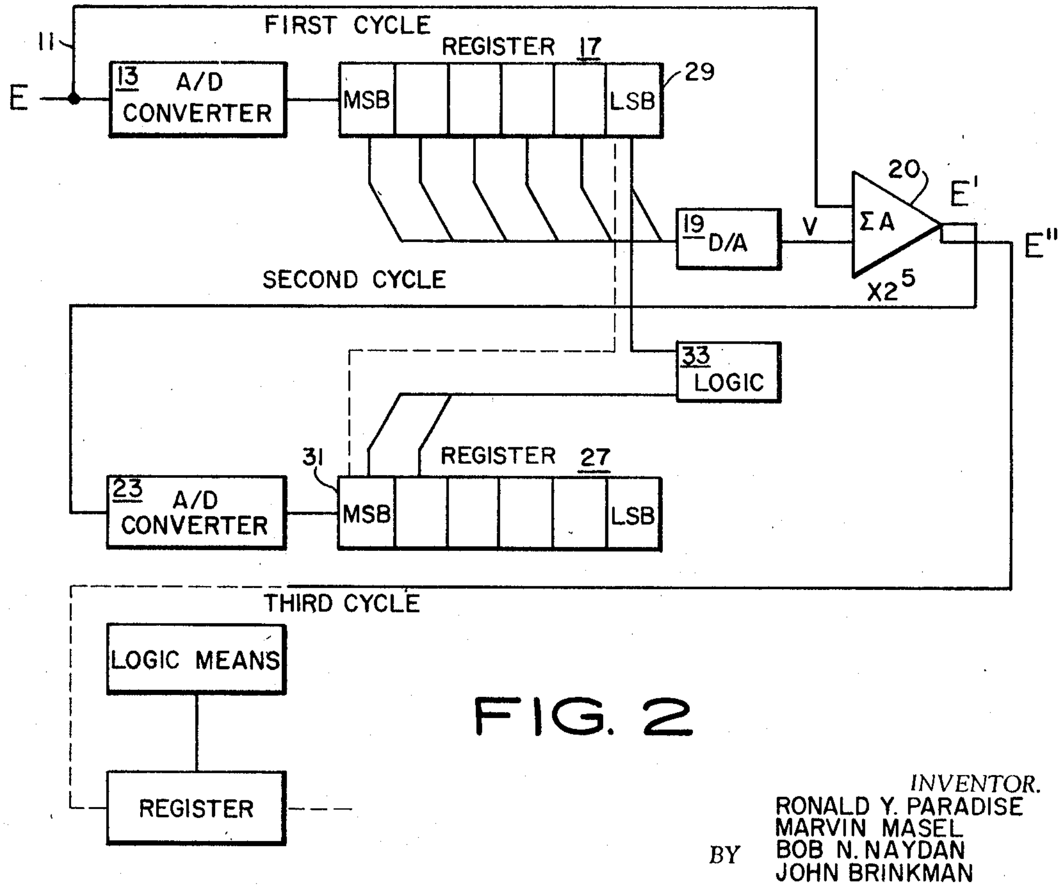
FIG. 2 is a simplified block diagram of a specific implementation of the invention.

Applying the system just described to the embodiment shown in FIG. 2, an input signal having a weight of E is applied over line 11 to an analog-to-digital converter 13. Converter 13 may be either a ladder network converter using a successive approximation technique similar to that shown in the U.S. Pat. No. 3,071,324, to G. Schroeder et al. except that conversion is a "straight-line" conversion; or, the converter may be a ramp converter having an integrator amplifier and a comparator amplifier such as described in current literature, e.g., R. K. Richards "Digital Computer Components and Circuits," D. Van Nostrand Co., Inc. 1957 Edition, pages 487 and 488. Assuming that the A/D converter used is a ladder network, converter 13 will form a digital value from analog signal E. This digital value is produced in shift register 17. The contents of this register are transferred, at the end of the first A/D conversion, to digital input of digital-to-analog converter 19. Digital-to-analog converter contains a summing amplifier 20 which adds the digital-to-analog converter output V to the input signal E, fed in by line 11. The digital-to-analog converter summing amplifier 20 also provides a scale factor of $2^5$, i.e., it has a gain of 32. The output of amplifier 20, denominated E' [where E'=(E−V)×32], is then fed into a second analog-to-digital converter 23, which may be the same as, similar to, or different from converter 13. The output of converter 23 is fed to register 27. Both registers 17 and 27 are 6-bit registers. Register 17 provides the coarse value while register 27 provides the fine value. Due to the difference in scale factor of $2^5$, the two registers, 17 and 27, have one common bit, i.e., least significant bit 29 of register 17 correspond to the most significant bit 31 of register 27. The coarse and fine values in these registers are combined by adding the contents of register 27 to register 17. The information contained in MSB 29 and LSB 31 is used by logic 33 to generate a "carry," as required. The resultant output will be an 11-bit binary number consisting of the contents of register 27, not including the MSB 31, and the contents of register 17 as modified by logic 33. The MSB of the output will correspond to the MSB of register 17, the LSB of the output will correspond to the LSB of register 27.

Thus, in the first cycle, a coarse binary value is obtained, in the second cycle, a fine value is obtained. It is possible to repeat this cycle and again compare the reconverted value of the first two cycles with the original signal and obtain an even finer digital value which is consolidated in the same manner as already described with the values obtained after the first and second cycles.

In the embodiment of FIG. 2, certain adjustments are required. Thus, in the comparison between E, the original signal, and V, the digital signal, reconverted to analog form, the system is so arranged that V will always be smaller than E. In this way, the value in the fine register is always added to the value in the coarse register.

Figure 3:
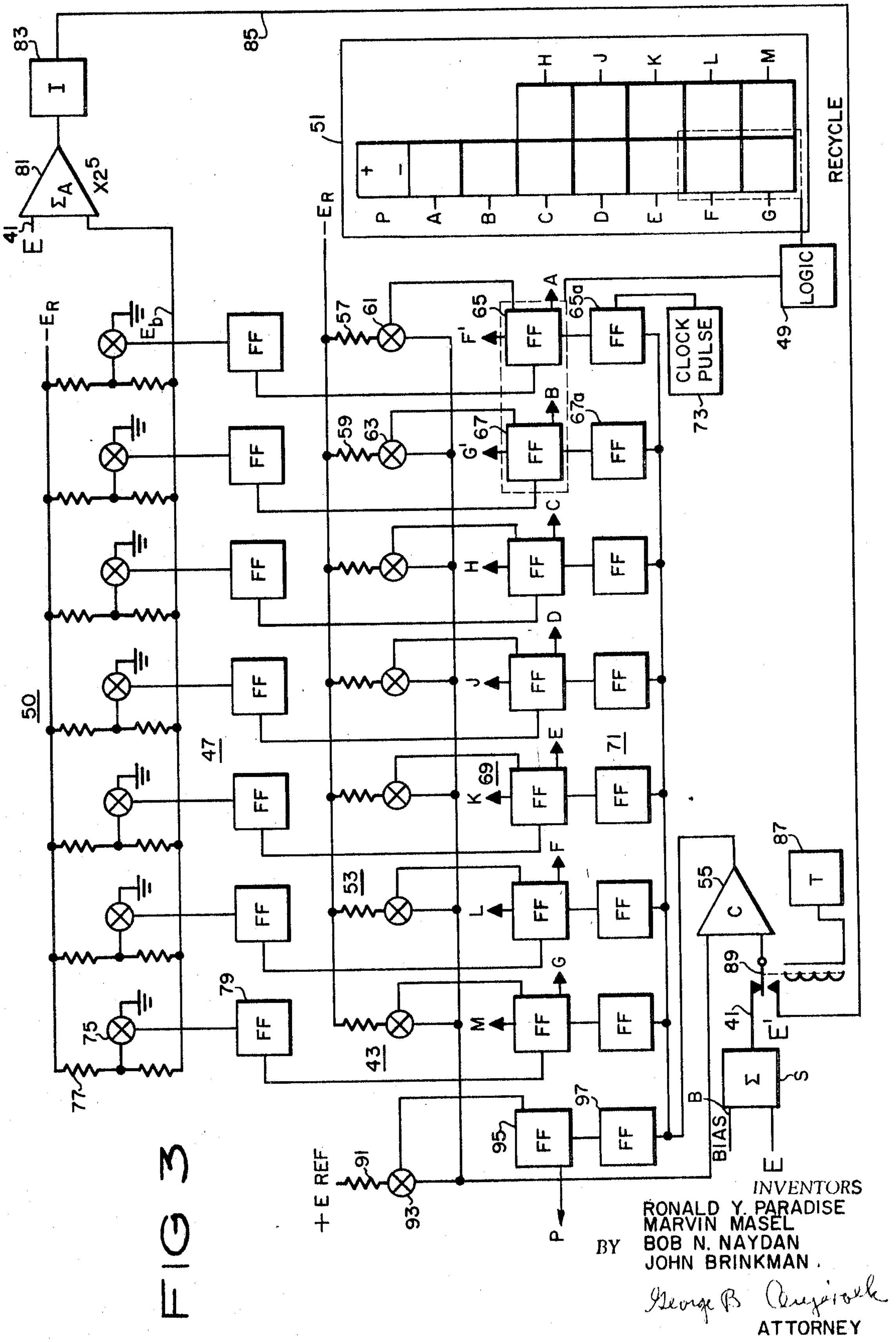
FIG. 3 is a schematic circuit drawing of an embodiment used in practice.

In carrying the invention into practice, it is advantageous to use the arrangement shown in FIG. 3. The initial analog-to-digital conversion is performed by a switch resistor-type of ladder network similar to that described in the U.S. Pat. No. 3,071,324 to G. Schroeder et al. A simple explanation of the conversion is that the signal, as a voltage is fed to a comparator. A reference voltage is also fed to the comparator, but across a ladder of parallel resistors. These resistors each have a predetermined ohmic value. Usually, they correspond to binary numbers, but as shown in the above-mentioned G. Schroeder et al. patent, other digital systems may be used. The system acts very much like a balance. The input signal is on one side of the balance; the individual resistors which are switched into the network are on the other side of the balance. In effect, the signal is being "weighed." parallel resistors are sequentially switched into the network until the IR across the ladder network corresponds to the signal voltage E. The "-weight" of the individual resistors which have been switched into the network so that the IR across the ladder is equal to the signal voltage E then can be considered as analogous to the individual weights on one side of a scale which are used to balance some unknown material. The "total" of these resistors then corresponds to a digital value of the input signal. The switching in and out of the network (preferably termed "enabling into" and "shorting out") of the resistors is accomplished by means of a register and a shift register. In an arrangement shown in FIG. 3, the input signal E in line 41 is fed to ladder network type, analog-to-digital converter 43 having a plurality of registers, one of which remembers the values of the resistors switched into the ladder network. From converter 43, the digital information passes to output register 51 as well as to a summing network register 47. The value in summing network register 47 is used for reconversion back to analog form in digital-to-analog converter 50. This reconverted value $E_b$ is then subtracted from the original input signal E, and the difference is multiplied by a factor of $2^5$. Now, in the embodiment shown in block diagram in FIG. 2, this new value demoninated as E' was then fed into a second converter 23. In the embodiment shown in FIG. 3 however, the new value E' is fed to the same converter 43 as the original signal E. The digital value corresponding to E' is then obtained in converter 43 and the two most significant bits of the second analog-to-digital conversion are added to or subtracted from the results of the first conversion in output register 51 as determined by logic means 49. The digital sum in the output register 51 can then be fed to a digital computer. In order to insure that the operation will always be in one direction, i.e., addition, a slightly negative bias signal B is added to the value E on the first conversion through a summing circuit S. Thus, during the first coarse conversion, the effect on this bias signal is to assure that the signal produced by the summation of the output of ladder 50 and the original input analog signal E will always be slightly negative. Consequently, during the subsequent conversion when the bias signal is no longer in the circuit, the results of the fine digital conversion will always be added to the results of the first coarse digital conversion in register 51 to produce a digital output signal accurately reflecting the magnitude of the original input analog signal.

The equipment shown in FIG. 3 is started by some external piece of equipment, e.g., navigation equipment supplying some input signal over line 41. This starts off a timer and converter 43 which will convert the input signal into a digital value by enabling into a ladder-resistor-network 53, the successive "rungs" of the ladder which are in parallel. This input signal, fed over line 41 is weighed or compared to a reference signal $-E_R$ (which in this case is a negative value). Both the input signal E and the reference signal $-E_R$ are fed to a comparator 55. The reference signal fed as a negative value so as to produce a difference in the desired phase is dropped across ladder resistor network 53. If the two signals are equal, no resistors are enabled into the network. If not, then, sufficient resistors are sequentially enabled into the network so that current *x* resistance across network 53 is equal to the signal E fed to the comparator. The individual parallel resistors, 57, 59, etc. are enabled into network 53 by switches 61, 63, etc. These switches in turn are controlled by the action of flip-flops 65, 67 in register 69. The individual flip-flops 65, 67 of register 69 are in turn acted on by corresponding flip-flops **65*a*, 67*a*, in shift register 71 having a clock pulse source 73 which will activate the individual flip-flops 65*a*, 67*a*. The passing of a pulse through flip-flop 65*a* will cause flip-flop 65 to close switch 61 so as to enable resistor 57 into the network. Signal $-E_R$ dropped across resistor 57 is then compared with signal E applied to comparator 55. If the two are not equal, i.e., if the IR drop across resistor 57 is not equal to the signal E on line 41, then, the pulse through the next flip-flop, i.e., flip-flop 67, will cause this flip-flop to close switch 63 so as to enable resistor 59 into the network. The IR drop across resistors 57 and 59 is then compared with the signal E on line 41 by comparator 55. Eventually, sufficient resistors in network 53 are enabled into the network by this arrangement so that the IR drop across the ladder of resistors is equal to the signal E. The flip-flops in register 69** which have enabled the resistors into the network can then provide a digital "reading" of the value of the input signal E.

The contents of register 69 are then transferred to the output register 51 as designated by the letters A—G associated with the various flip-flops of the register 69. The contents are also transferred to summing network register 47. Register 47, in turn, drives digital-to-analog converter 50, consisting of a ladder network of resistors 77 and control switches 75. Each flip-flop 79 in register 47, representing one bit controls a switch 75. The input signal E is fed to amplifier 81 where it is summed with the output $E_b$ of digital-to-analog converter network 50. The difference between the input signal E and the reconverted analog signal $E_b$ is inverted and amplified by inverter 83 to provide a signal E′. This signal −E′ is now applied to converter 43 over line 85.

After the time required for this first conversion, a second conversion is started by the action of timer 87, which will cause relay switch 89 to change the input into comparator 55 from the line 41 to line 85.

The second conversion proceeds the same way as the first conversion. At the start of the second conversion, the first "reading" of register 69 also appears in the output register 51 as well as in register 69. This "reading" is immediately erased before the second conversion from register 69 but remains in the output register 51. At the end of the second conversion, the most significant bits of register 69, i.e., bits 65 and 67 are added to the results of the first conversion in the output registers. It is possible to handle both positive and negative input signals by having one additional resistor 91 and switch 93 connected to a positive reference supply in the network to bias the entire signal range. The first step when using this method will be to determine the polarity of the signal. This is accomplished by comparator 55 which senses a negative input signal and enables flip-flops 95 and 97 in registers 69 and 71 respectively, which, in turn, enable resistor 91 into the network. Thus, if the original input signal is negative, switch 93 will be closed and resistor 91 will be used for the duration of the conversion. Successive enabling of switches 61, 63, etc. will then progressively make the input to comparator 55 less positive until the latter is equal to and opposite to that of the negative input signal applied to the comparator along line 41.

It will be observed that the present invention provides for an analog-to-digital converter wherein analog signals are converted to digital values for processing in digital computer. According to the present inventive concept, the analog signal is first converted into a coarse digital value. This coarse digital value is then reconverted back into analog form and subtracted from the original signal. The difference between the two signals is then amplified by a predetermined scale factor and converted into digital form to provide a fine digital value which is then combined with the coarse digital value to form an accurate output value which represent the input signal.

To this end, the equipment, required for these operations comprises an input section which will apply the analog input signal to a comparator where the input signal is compared with a reference signal dropped across a resistor ladder network type converter to obtain a first digital count; register means to enable those resistors into the network which will weigh the analog signal against the reference signal across the network and including a memory register remembering which resistors have been so enabled into the network; a summing network responsive to the register, and a summing amplifier into which is fed the output of the summing network as well as the original analog input signal, wherein said original input signal is compared to the output of the summing network and applied by a predetermined scale factor, thus providing a second analog input signal; a loop feeding said second input signal to said input section so as to provide a second digital count in said register means; logic means to compare at least one of the most significant bits of said second digital count in said register means with at least one of the least significant bits of said first digital count in said memory register so that a consolidation of said first and second digital counts can be provided to external equipment.

Furthermore, after the first two cycles, the digital-to-analog reconversion comparison and again analog conversion of the difference can be contained for a third and successive cycles to obtain more precise results with each reconversion.

While the present invention has been described in a preferred embodiment, it will be obvious to those skilled in the art that various modifications can be made therein within the scope of the invention, and it is intended that the appended claims cover all such modifications.

I claim:

1. Apparatus of the class described comprising in combination:

a. an analog input section including an input line responsive to a first analog input signal, a feedback line responsive to a second analog signal, switch means interposed between said input line and said feedback line, and means causing said switch means to be periodically activated between a first and second condition;

b. a first summing circuit having a pair of inputs and an output, one of said inputs being connected to said input line and the other of said inputs being connected to a bias signal source, c. a comparator having a plurality of inputs and an output, one of said inputs being coupled to said first summing circuit in a first condition of said switch means and being coupled to said feedback line in a second condition of said switch means, an analog-to-digital converter including a plurality of parallel resistors arranged in a ladder network and adapted to be enabled into or switched out of said network respectively for providing another input to said comparator whereupon a first reference signal impressed upon said network can be compared with the analog output signal from said first summing circuit, d. first register means responsive to the output of said comparator for sequentially enabling each of said plurality of resistors into said ladder network thereby altering the value of the first reference signal impressed upon said network until said first reference signal substantially corresponds in magnitude to said first summing circuit analog output signal applied to said comparator through said switch means in a first condition thereof, e. an output register connected to said first register means for remembering the values of those resistors enabled into said network so as to provide a coarse digital value for the first analog input signal from said input section through said switch means in a first condition thereof, f. a digital-to-analog converter network responsive to said first register means, g. a summing amplifier into which is fed the output of the digital-to-analog converter network as well as the first analog input signal applied to said input section, said summing amplifier being adapted to produce said second analog signal on said feedback line wherein said second analog signal is equal to the difference between said first analog signal and the output of said digital-to-analog converter amplified by a predetermined factor, h. the output of said summing amplifier being connected to said feedback line whereby said feedback line is adapted to feed back said second analog signal to said comparator through said switch means when the latter is activated to its said second condition, whereby said second analog signal may be compared to said first reference signal impressed across said analog-to-digital converter to produce a fine digital value corresponding to said second analog signal in said memory register means, and i. logic means responsive to a portion of the fine digital value in said first register and a portion of said coarse digital value in said output register for adding these two portions together and for introducing the result to said output register, j. said analog-to-digital converter further including means for superimposing a second reference signal of opposite polarity over said first reference signal in response to a second analog input signal of opposite polarity to said first analog input signal applied to said input section and for applying to said comparator said superimposed second reference signal during the time said switch means is activated to its first condition, and k. means responsive to said superimposing means for indicating the polarity of said second analog input signal.

2. The apparatus of claim 1 wherein said means for superimposing said second reference signal over said first reference signal comprises:

a. a flip-flop responsively coupled to the output of said comparator, and b. a second reference voltage source impressed across a fixed resistance and connected in series to said input of said comparator through a second switch means, said second switch means being normally maintained in an open circuited condition in response to an output signal of a first polarity from said comparator and being normally maintained in a closed circuit condition in response to an output signal of a second polarity from said comparator.